United States Patent

Haji

[11] Patent Number: 5,846,875
[45] Date of Patent: Dec. 8, 1998

[54] METHOD OF PRODUCING A SEMICONDUCTOR DEVICE

[75] Inventor: Hiroshi Haji, Chikushino, Japan

[73] Assignee: Matsushita Electric Industrial Co., Ltd., Osaka, Japan

[21] Appl. No.: 910,997

[22] Filed: Aug. 14, 1997

[30] Foreign Application Priority Data

Aug. 20, 1996 [JP] Japan ..................... 8-218176

[51] Int. Cl.⁶ .................................................. H01L 21/44
[52] U.S. Cl. .......................... 438/614; 438/612; 438/613; 438/976; 438/669; 438/652
[58] Field of Search ..................... 438/612, 613, 438/976, 614, 615, 616, 617, 669, 652

[56] References Cited

FOREIGN PATENT DOCUMENTS 57-201052  12/1982  Japan .

*Primary Examiner*—John F. Niebling
*Assistant Examiner*—David A. Zarneke
*Attorney, Agent, or Firm*—Stevens, Davis, Miller & Mosher, L.L.P.

[57] ABSTRACT

A method of producing a semiconductor device includes the step of: preparing a wafer on which a protective film is formed except for the area of an aluminum electrode formed on the wafer; etching an oxide film present on the aluminum electrode formed on the wafer thereby removing the oxide film; forming a metal film on the wafer; put an adhesive tape on the wafer so that the adhesive tape adheres to the wafer; and peeling off the adhesive tape. Since the adhesion between the metal film and the protective film is weak and the adhesion between the metal film and the aluminum electrode is strong, the metal film on the protective film is peeled off while the portion of the metal film present on the aluminum electrode remains unremoved. The metal film remaining on the aluminum electrode has good conformability with a solder bump, and thus it is possible to obtain good wettability between the solder bump and the aluminum electrode in the process of forming the solder bump on the aluminum electrode. Thus, the invention provides an easy and inexpensive technique to solve the problem of poor adhesion between the bump and the aluminum electrode.

13 Claims, 5 Drawing Sheets

METHOD OF PRODUCING A SEMICONDUCTOR DEVICE

BACKGROUND OF THE INVENTION

1. Field of the Invention

The present invention relates to a method of producing a semiconductor device including a bump formed on an electrode.

2. Description of the Related Art

In the art of the semiconductor device technology, it is known to form an electrode of aluminum or the like on a semiconductor wafer during the process of producing a semiconductor device. Furthermore, it is also known to form a protruding bump of a bump material such as solder on the aluminum electrode. However, conformability between the aluminum electrode and the bump material such as solder is generally poor, and therefore it is difficult to obtain good wettability in the process of forming the bump on the aluminum electrode. One known technique to avoid the above problem is to form a multilayer metal film consisting of layers of chromium, copper, gold, nickel, or the like on an aluminum electrode and then form a bump on the multilayer metal film (refer to for example JP-A-57-201052). In this technique, since the multilayer metal film having good conformability with the bump is disposed between the aluminum electrode and the bump, it is possible to achieve good wettability in the process of forming the bump on the aluminum electrode.

The multilayer metal film is formed by repeating a complicated process including the steps of depositing a metal film over the entire surface of a wafer, coating and baking a photosensitive resin, exposing the photosensitive resin to light via a pattern mask thereby forming a pattern in the photosensitive resin, selectively etching the metal film, and removing the photosensitive resin. However, this technique needs expensive production facilities and furthermore it is required to prepare expensive pattern masks for each type of semiconductor device. As a result, the total cost becomes high. Another problem of this technique is poor productivity due to the complexity of the process.

SUMMARY OF THE INVENTION

It is an object of the present invention to provide a semiconductor device which can be easily produced at a low cost without encountering the problem of poor conformability between a bump and an electrode such as an aluminum electrode. It is another object of the present invention to provide a method of such a semiconductor device.

According to an aspect of the invention, there is provided a method of producing a semiconductor device, the semiconductor device including an electrode and a protective film both formed on a surface of a semiconductor substrate in such a manner that the electrode is exposed via an opening of the protective film, the protective film having poor adhesion to metal, the method comprising the steps of: removing an oxide film present on the surface of the electrode; forming a metal film on the surface of the electrode and also on the surface of the protective film; and peeling off the metal film from the protective film in such a manner that the portion of the metal film on the electrode remains unremoved.

According to another aspect of the invention, there is provided a method of producing a semiconductor device, the semiconductor device including an electrode and a protective film both formed on a surface of a semiconductor substrate in such a manner that the electrode is exposed via an opening of the protective film, the protective film having poor adhesion to metal, the method comprising the steps of: removing an oxide film present on the surface of the electrode; forming a metal film on the surface of the electrode and also on the surface of the protective film; peeling off the metal film from the protective film in such a manner that the portion of the metal film on the electrode remains unremoved; and forming a bump on the electrode.

According to the invention in either aspect, it is possible to easily form a metal film having good conformability with a bump on the upper surface of an electrode made of aluminum or the like.

DESCRIPTION OF THE PREFERRED EMBODIMENTS

Figure 1:
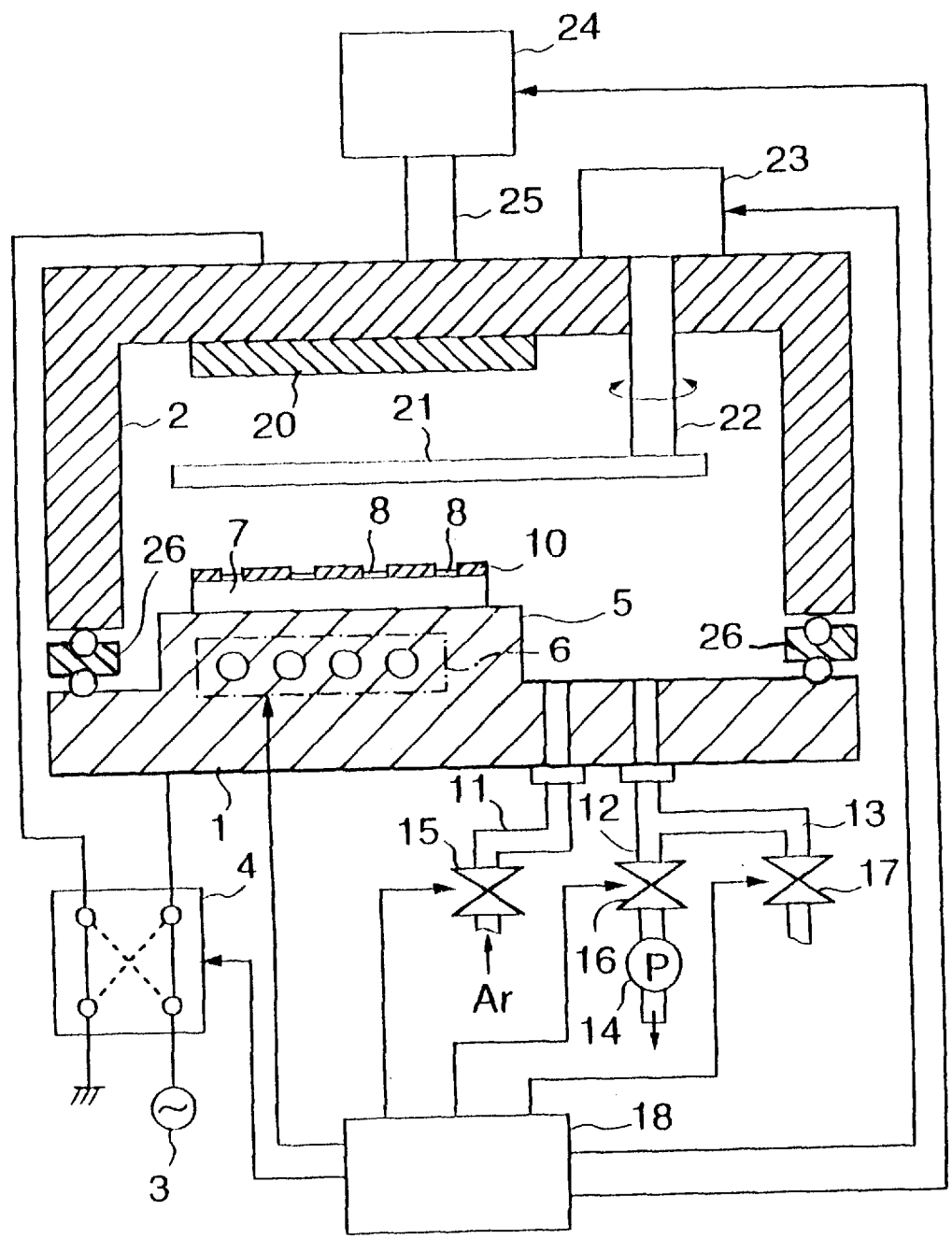
FIG. 1 is a schematic diagram illustrating an apparatus for forming a metal film according to an embodiment of the present invention.
Figure 4:
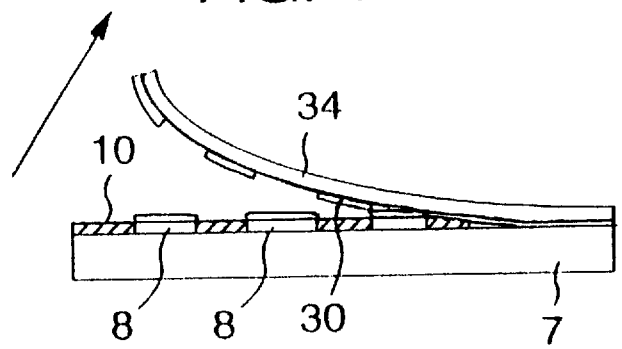
FIG. 4 is a schematic diagram illustrating a method of removing the metal film according to an embodiment of the invention.
Figure 5A:
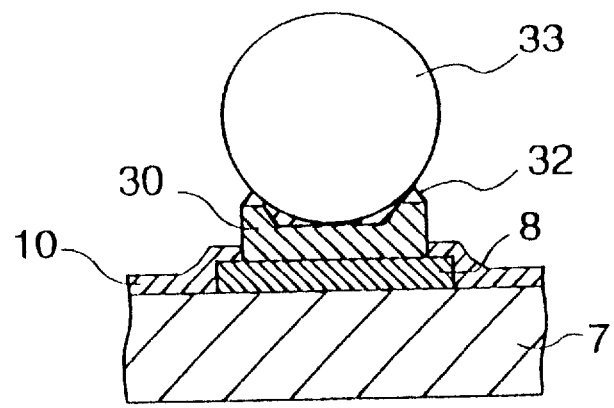
FIGS. 5A and 5B are schematic diagrams illustrating a method of forming a bump according to an embodiment of the invention.
Figure 5B:
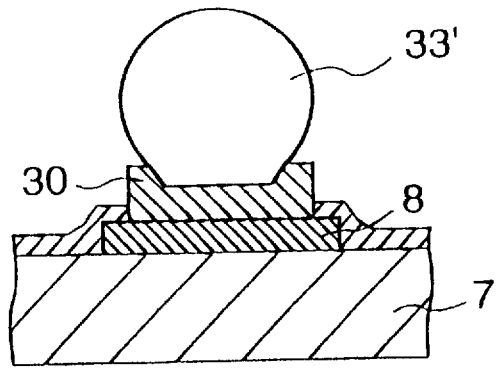
Figure 6:
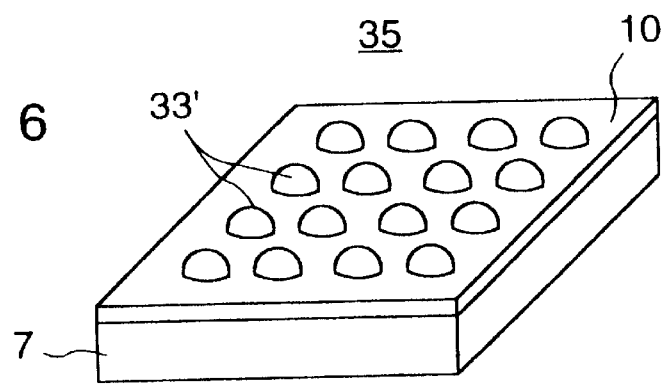
FIG. 6 is a perspective view of a semiconductor device according to an embodiment of the invention.

The present invention is described in further detail below referring to embodiments in conjunction with the accompanying drawings. FIG. 1 is a schematic diagram illustrating an apparatus for forming a metal film according to an embodiment of the present invention. FIGS. 2A–2E are cross-sectional views illustrating the process of forming a protective film on a semiconductor substrate having an electrode formed thereon. FIGS. 3A–3E are cross-sectional views illustrating the process of forming a metal film. FIG. 4 is a schematic diagram illustrating a method of removing the metal film. FIGS. 5A and 5B are schematic diagrams illustrating a method of forming a bump. FIG. 6 is a perspective view of a semiconductor device.

The semiconductor device to be produced according to the present embodiment of the invention will be described first. FIG. 6 illustrates the semiconductor device produced by the method which will be described later. The semiconductor device 35 includes protruding bumps 33' formed on the upper surface of a semiconductor wafer 7. These bumps 33' are protruded on aluminum electrodes 8 (which will be described later) formed on the upper surface of the wafer 7. The surface of the wafer 7 is coated with a protective film 10 except for the areas where the bumps 33' are formed. The protective film 10 is made of a material (such as $SiO_2$)

having poor conformability and poor adhesion to a metal film such as a copper film (which will be described later).

Referring to FIG. 1, the apparatus for forming the metal film is described below. Reference numeral 1 denotes a base plate on which a chamber 2 is provided. An air-tight chamber is formed with the base plate 1 and the chamber 2. Reference numeral 3 denotes a high-frequency power supply connected to the base plate 1 and the chamber 2 via a switch 4. By properly operating the switch 4, it is possible to selectively applying a high-frequency voltage to the base plate 1 and the chamber 2. That is, the base plate 1 and the chamber 2 also serve as electrodes.

A stage 5 having an embedded heater 6 is disposed on the inner surface of the base plate 1. A semiconductor wafer 7 is placed on the stage 5, and the wafer 7 is heated by the heater 6. Aluminum electrodes 8 are formed on the surface of the wafer 7.

Pipes 11, 12, and 13 are connected to the base plate 1. The pipe 11 is used to supply gas such as Ar (argon), which is used to generate a plasma, into the chamber. The pipe 12 is used to evacuate the inside of the chamber 2 using a pump 14. The pipe 13 is used to make the chamber 2 communicate with the outside atmosphere to return the pressure in the chamber to the atmospheric pressure before separating the chamber 2 from the base plate 2 to put a wafer 7 into the chamber or take out the wafer from the chamber 2. The pipes 11, 12, and 13 have valves 15, 16, and 17, respectively. Furthermore, there is provided a controller 18 for controlling the switch 4, the valves 15, 16, and 17 and other parts.

A copper plate target 20 is disposed on the inner surface of the upper wall of the chamber 2. A shutter 21 is disposed immediately beneath the target 20. An end portion of the shutter 21 is connected to a vertical rotation shaft 22. A driving mechanism 23 serving as shutter driving means for rotating the rotation shaft 22 is disposed on the outer surface of the upper wall of the chamber 2. The shutter 21 can be driven by the driving mechanism 23 so that it horizontally rotates about the rotation shaft 22 until it comes to either a position where the target 20 is masked by the shutter 21 or a position where the target 20 is exposed.

Reference numeral 24 denotes a chamber opening/closing means for opening and closing the chamber 2 via a rod 25 which moves up and down. Reference numeral 26 denotes a sealing member for sealing the connection between the base plate 1 and the chamber 2. The sealing member 26 also serves to make electrical insulation between the base plate 1 and the chamber 2. The driving mechanism 23 and the chamber opening/closing means 24 are also controlled by the controller 18.

An example of the process of forming the protective film 10 is described below with reference to FIGS. 2A–2E.

Figure 2A:
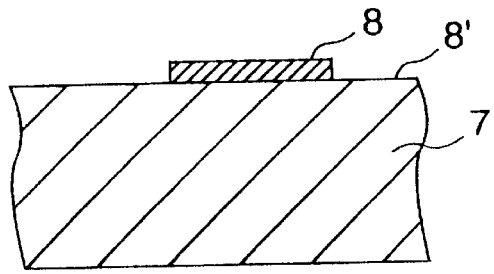
FIGS. 2A–2E are cross-sectional views illustrating the process of forming a protective film on a semiconductor substrate having an electrode formed thereon.
Figure 2B:
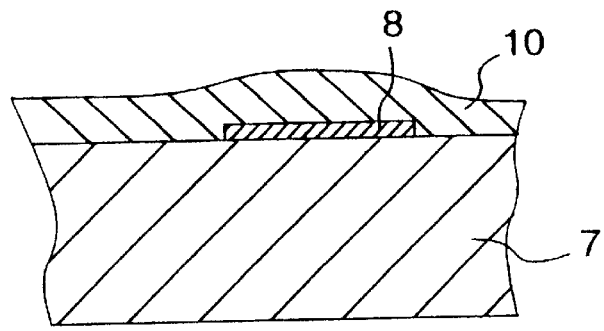

After forming an aluminum electrode 8 on the upper surface of a wafer 7 as shown in FIG. 2A, the upper surface of the wafer 7 is coated with low-melting-point glass 10 serving as the protective film. This protective film is deposited by means of a plasma CVD technique so that the aluminum electrode 8 is also covered with the protective film as shown in FIG. 2B.

A photoresist 19 such as a photosensitive resin is then coated on the protective film, and the photoresist is exposed to light via a mask in such a manner that those portions of the photoresist corresponding to the portions of the protective film 10 to be removed are prevented by the mask from being exposed to light. The portions of the photoresist 19 exposed to light is cured although those portions which have not been exposed to light remain uncured.

Figure 2C:
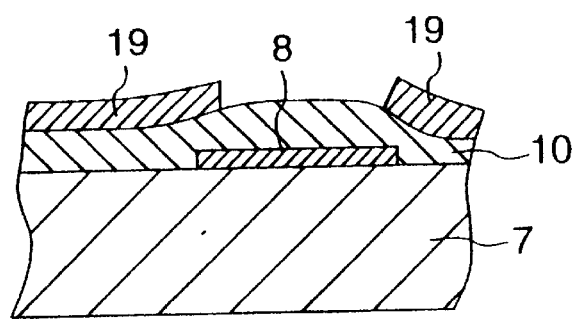

The wafer 7 is then cleaned so that the uncured portions of the photoresist 19 are removed as shown in FIG. 2C.

Figure 2D:
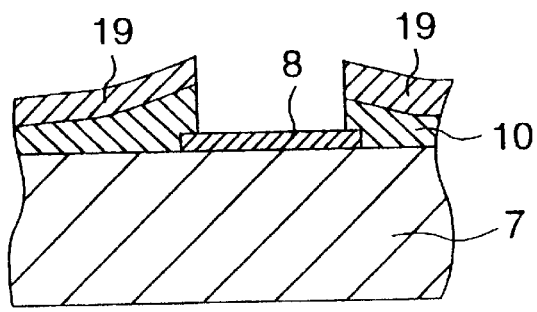
Figure 2E:
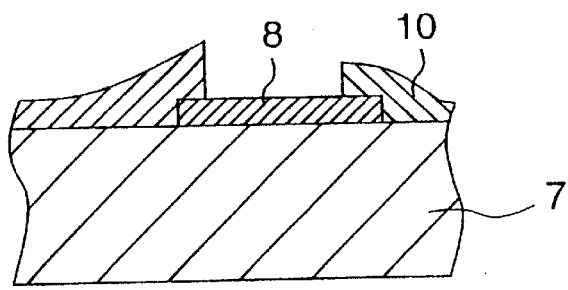

Then the protective film 10 is etched using the remaining photoresist 19 as a mask as shown in FIG. 2D. Finally, the photoresist 19 is removed by means of chemical processing. Thus, the protective film 10 is formed on the wafer 7 as shown in FIG. 2E.

Figure 3A:
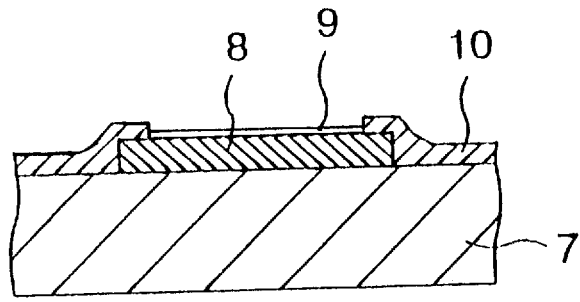
FIGS. 3A–3E are cross-sectional views illustrating the process of forming a metal film according to an embodiment of the invention.

Referring now to FIGS. 3A–3E, a method of forming a copper film serving as the above-described metal film on the aluminum electrode 8 formed on the wafer 7 is described below. In FIG. 3A, there is an oxide film 9 on the surface of the aluminum electrode 8 wherein the oxide film 9 is produced as a result of reaction between air and aluminum. The surface of the wafer 7 except for the area where the aluminum electrode 8 is formed is covered with the protective film 10 which has been formed in the previous processing step using a material such as $SiO_2$ having poor adhesion to metal. Thus, the aluminum electrode 8 is exposed through the opening of the protective film 10. In a later processing step, the wafer 7 is divided into a plurality of chips each serving as a semiconductor device.

Figure 3B:
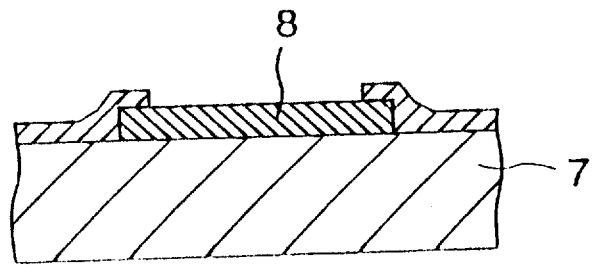

First, the unwanted oxide film 9 is removed as shown in FIG. 3B. An example of the method of removing the oxide film 9 is described below referring to FIG. 1. The wafer 7 is placed on the stage 5 as shown in FIG. 1, and Ar gas is supplied into the chamber 2 via the pipe 11 wherein the inside of the chamber 2 is evacuated beforehand by a pump 14. During the above operation, the shutter 21 is positioned immediately beneath the target 20 so that the target 20 is masked by the shutter 21.

The switch 4 is operated so that a high-frequency voltage is applied to the base plate 1 serving as the lower electrode while the chamber 2 serving as the upper electrode is grounded. As a result, Ar gas inside the chamber 2 is excited and ionized by the high-frequency voltage. The surface of the wafer 7 is bombarded by Ar ions, and thus the oxide film 9 present on the aluminum electrode 8 is removed. The base plate 1, to which the high-frequency voltage is applied, is biased to a negative voltage and therefore electrically positive Ar ions are strongly attracted toward the base plate 1 and the Ar ions collide with the base plate 1. The collision of the Ar ions with the surface of the wafer 7 causes the protective film 10 and the oxide film 9 to be sputtered upward into particles. If the sputtered particles deposit on the target 20, the target 20 is contaminated by the particles. To avoid such the contamination, the target 20 is protected by the shutter 21.

Figure 3C:
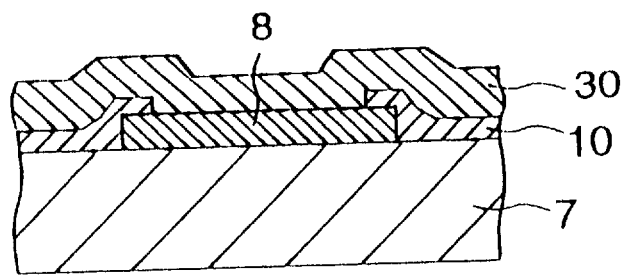
Figure 3D:
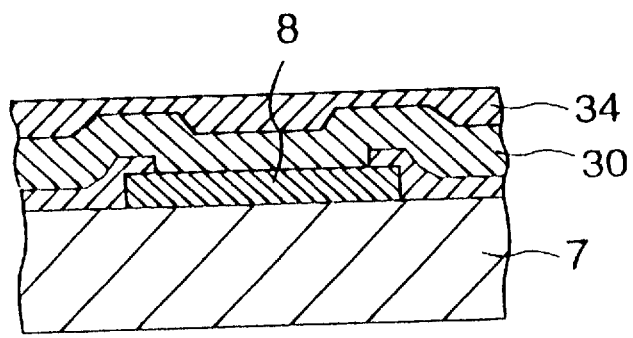
Figure 3E:
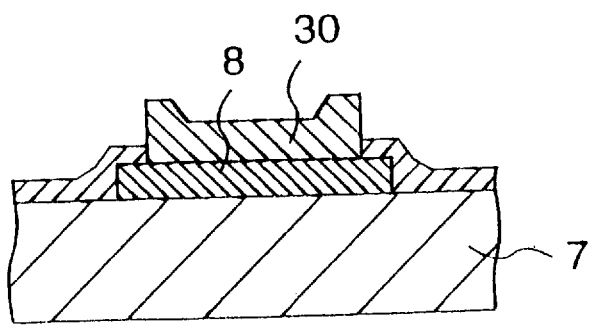

Then a metal film 30 is formed on the wafer 7 as shown in FIG. 3C. Referring again to FIG. 1, the method of forming the metal film 30 is described below. First, the shutter 21 is rotated by the driving mechanism 23 so that the shutter 21 is removed from the location immediately beneath the target 20 and thus the target is exposed. The switch 4 is turned so that the base plate 1 is grounded and a high-frequency voltage is applied to the chamber 2 so that Ar ions are now attracted toward the target 20 biased to a negative voltage and thus the Ar ions collide with the target 20. As a result, the copper target 20 is sputtered into particles which deposit on the wafer 7, and thus a metal film (copper film) 30 is formed.

During or after the operation of forming the metal film 30, the wafer 7 is heated by the heater 7. Referring to FIG. 3C, when the wafer 7 is heated, the aluminum electrode 8, the protective film 10, the metal film 30 are also heated by means of heat conduction. Since the aluminum electrode 8 and the metal film 30 are both made of metal, they have a great coefficient of thermal expansion. In contrast, the protective film (SiO$_2$) 10 made of glass has a small coefficient of thermal expansion. Therefore, when the aluminum electrode 8, the protective film 10, and the metal film 30 are heated, although the aluminum electrode 8 and the metal film 30 expand to a similar extent and thus good adhesion is maintained between the aluminum electrode 8 and the metal film 30, a great difference occurs in the thermal expansion between the protective film 10 and the metal film 30, and thus the metal film 30 hardly remain adhering to the protective film 10.

The metal film 30 is removed from the protective film 10 so that the potion of the metal film 30 present on the aluminum electrode 8 remains thereon. A specific method of removing the metal film 30 in such a manner is shown in FIG. 4. An adhesive tape 34 is put on the metal film 30 so that the adhesive tape 34 adheres to the metal film 30 (also refer to FIG. 3D). If the adhesive tape 34 is peeled off, the metal film 30 on the protective film 10 is also peeled off together with the adhesive tape 34 while the portion of the metal film 30 on the aluminum electrode 8 remains thereon. This occurs for the following reason. The metal film 30 has good adhesion to the aluminum electrode 8 because they are both made of metal. On the other hand, the metal film 30 has very poor adhesion to the protective film 10 made of glass. In addition, when the wafer 7 is heated by the heater 6, as described above, a great difference occurs in the amount of thermal expansion and thus the metal film 30 hardly adheres to the protective film 10. Therefore, by using the method shown in FIG. 4, the metal film 30 can be easily removed from the protective film 10 while the portion of the metal film 30 on the aluminum electrode 8 remains thereon.

Referring now to FIGS. 5A and 5B, a method of forming a solder bump on the aluminum electrode of the semiconductor device is described below. As shown in FIG. 5A, the metal film 30 is coated with flux 32, and then a solder ball 33 is placed thereon. After that, a heating process is performed so that the solder ball 33 is fused and then solidified thereby forming a solder bump 33' as shown in FIG. 5B (also refer to FIG. 6). If the solder bump 33' is formed directly on the aluminum electrode 8, poor conformability occurs between the solder bump 33' and the aluminum electrode 8. In this embodiment, since the solder bump 33' is formed on the aluminum electrode 8 via the metal film 30 having good conformability with the solder bump 33', good wettability can be obtained between the solder bump 33' and the metal film 30. In the present invention, any metal may be employed as a material to form the metal film 30 as long as the metal has good conformability with the solder bump and thus good wettability can be obtained in the process of forming the solder bump. For example gold, nickel, or similar metals may be employed in addition to copper employed in the above specific embodiment.

The solder bump may also be formed in such a manner that the metal film 30 is first coated with cream solder and then the cream solder is fused and solidified by means of a heating process. Alternatively, the solder bump may also be formed as follows. First, an electrically conductive metal ball made of high-melting point solder is placed on cream solder. Then, a heating process is performed such that only the cream solder is fused and solidified thereby firmly connecting the electrically conductive metal ball to the metal film 30 via the solder. Thus, there are various methods which can be employed to form the bump.

Figure 7A:
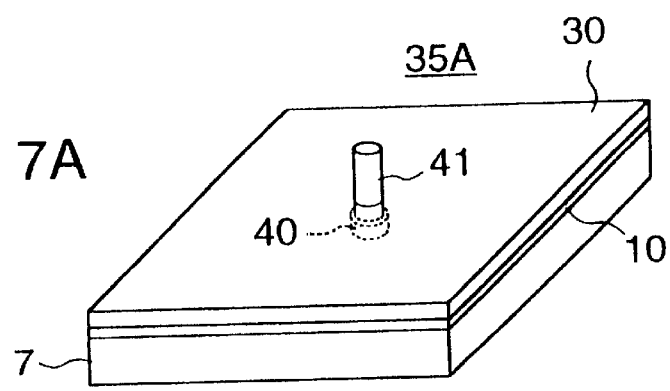
FIGS. 7A and 7B are schematic diagrams illustrating another method of removing the metal film, according to the invention.
Figure 7B:
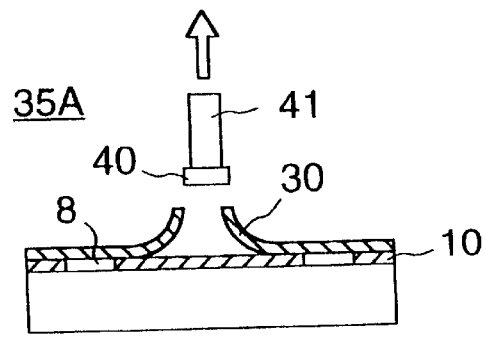

FIGS. 7A and 7B are schematic diagrams illustrating another method of removing the metal film, according to the invention. Referring to FIG. 7A, an aluminum electrode 8 of a semiconductor device 35A is formed on a wafer 7 in such a manner that the aluminum electrode 8 is present only in a peripheral area of the wafer 7. In FIG. 7A, a metal film 30 has already been formed by means of the method described above. Reference numeral 40 denotes a bar having a handle 41 extending upward. The bar 40 is placed on the wafer 7, and then the metal film 30 is formed so that the bar 40 is located under the metal film 30. If the handle 41 is drawn upward as shown in FIG. 7B, the metal film 30 is partially broken as shown in the figure. Then the metal film 30 is peeled off with an adhesive tape 34 using the method described above with reference to FIG. 4. In this technique, since the metal film 30 is partially broken before peeling off the metal film 30 with the adhesive tape 34, the metal film 30 is easily peeled off with the adhesive tape 34.

Figure 8:
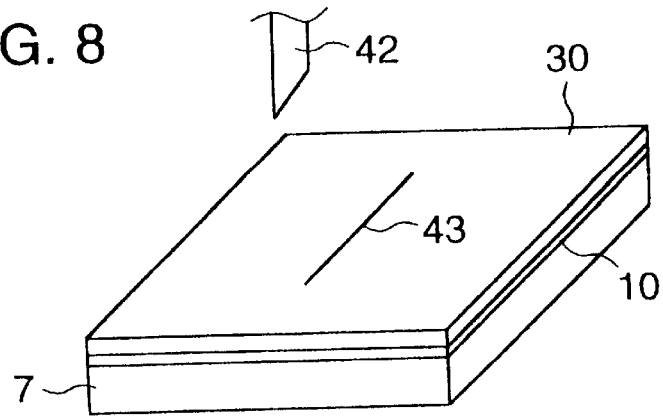
FIG. 8 is a schematic diagram illustrating still another method of removing the metal film, according to the invention.

FIG. 8 is a schematic diagram illustrating still another method of removing the metal film according to the present invention. In this method, the metal film 30 is cut along a line 43 using a cutter 42. After that, as shown in FIG. 4, an adhesive tape 34 is put on the metal film 30 so that the adhesive tape 34 adheres to the metal film 30, and the metal film 30 is peeled off with the adhesive tape 34. This technique also ensures that the metal film 30 is easily peeled off with the adhesive tape 34. As described above, there are various methods which may be employed to peel off the metal film 30 with the adhesive tape 34.

In the present invention, as described above, a metal film having good wettability with a bump is formed on an aluminum electrode in a simple fashion thereby avoiding the problem of poor conformability between the bump and the aluminum electrode.

What is claimed is:

1. A method of producing a semiconductor device, said semiconductor device including an electrode and a protective film both formed on a surface of a semiconductor substrate in such a manner that said electrode is exposed via an opening of said protective film, said protective film having poor adhesion to metal, said method comprising the steps of:

removing an oxide film present on the surface of said electrode;

forming a metal film on the surface of said electrode and also on the surface of said protective film; and peeling off said metal film from said protective film in such a manner that the portion of said metal film on said electrode remains unremoved.

2. A method of producing a semiconductor device, said semiconductor device including an electrode and a protective film both formed on a surface of a semiconductor substrate in such a manner that said electrode is exposed via an opening of said protective film, said protective film having poor adhesion to metal, said method comprising the steps of:

removing an oxide film present on the surface of said electrode;

forming a metal film on the surface said electrode and also on the surface of said protective film;

peeling off said metal film from said protective film in such a manner that the portion of said metal film on said electrode remains unremoved; and forming a bump on said electrode.

3. A method of producing a semiconductor device according to claim 1, wherein said step of forming the metal film includes the step of heating said protective film so as to make said metal film have poor adhesion to said protective film due to the difference in thermal expansion between said metal film and said protective film.

4. A method of producing a semiconductor device according to claim 1, wherein in said step of peeling off said metal film from said protective film, an adhesive sheet is used as means of peeling off said metal film.

5. A method of producing a semiconductor device according to claim 1, wherein said metal film is made of a material selected from the group consisting of copper, gold, nickel or the like.

6. A method of producing a semiconductor device according to claim 1, wherein said metal film is formed after a bar having a handle extending upward is placed on the surface of said protective film, and said bar is drawn upward so that said metal film is partially broken thereby making said metal film become easy to peel off.

7. A method of producing a semiconductor device according to claim 2, wherein said step of forming the metal film includes the step of heating said protective film so as to make said metal film have poor adhesion to said protective film due to the difference in thermal expansion between said metal film and said protective film.

8. A method of producing a semiconductor device according to claim 2, wherein said step of peeling off said metal film from said protective film is performed using an adhesive sheet as means of peeling off said metal film.

9. A method of producing a semiconductor device according to claim 2, wherein said metal film is made up of a material selected from the group consisting of copper, gold, nickel or the like.

10. A method of producing a semiconductor device according to claim 2, wherein said metal film is formed after a bar having a handle extending upward is placed on the surface of said protective film, and said bar is drawn upward so that said metal film is partially broken thereby making said metal film become easy to peel off.

11. A method of producing a semiconductor device according to claim 2, wherein in said step of forming the bump on said electrode, said bump is formed of a solder ball.

12. A method of producing a semiconductor device according to claim 2, wherein in said step of forming the bump on said electrode, said bump is formed of cream solder.

13. A method of producing a semiconductor device according to claim 12, wherein an electrically conductive metal ball made of high-melting point solder is placed on said cream solder.

* * * * *